United States Patent [19]

Guenthner

[11] 4,359,689
[45] Nov. 16, 1982

[54] CLOCK PULSE DRIVER

[75] Inventor: Russell W. Guenthner, Glendale, Ariz.

[73] Assignee: Honeywell Information Systems Inc., Phoenix, Ariz.

[21] Appl. No.: 111,456

[22] Filed: Jan. 11, 1980

[51] Int. Cl.³ ............................................. H03K 5/156
[52] U.S. Cl. ........................................ 328/72; 307/269
[58] Field of Search ..................... 328/55, 62, 72, 105, 328/63; 307/269

[56] References Cited

U.S. PATENT DOCUMENTS 4,165,490  8/1979  Howe, Jr. et al. ................. 328/63 X
4,223,392  9/1980  Lemaire et al. .................. 328/63 X Primary Examiner—James W. Davie
Attorney, Agent, or Firm—Edward W. Hughes; W. W. Holloway, Jr.; N. Prasinos

[57] ABSTRACT

A clock pulse driver has applied to it a system clock pulse signal, or system clock and produces a first set of individually enabled clock pulse signals, the leading edges of the pulses of which substantially coincide with the leading edges of the pulses of the system clock, a second set and a third set of clock pulse signals, the trailing edges of the pulses of which substantially coincide with the leading edges of the pulses of the system clock. The width of the pulses of the three sets of output signals are controllable by first, second and third delay pulse signals. The clock pulse driver also produces delay signals the pulses of which have a predetermined relationship to the pulses of the system clock which delay signals can be used to control the widths of the first, second and third sets of clock signals produced by the driver circuits, and to control the delay or offset of the first, second and third sets of clock signals produced by the driver circuit.

8 Claims, 20 Drawing Figures

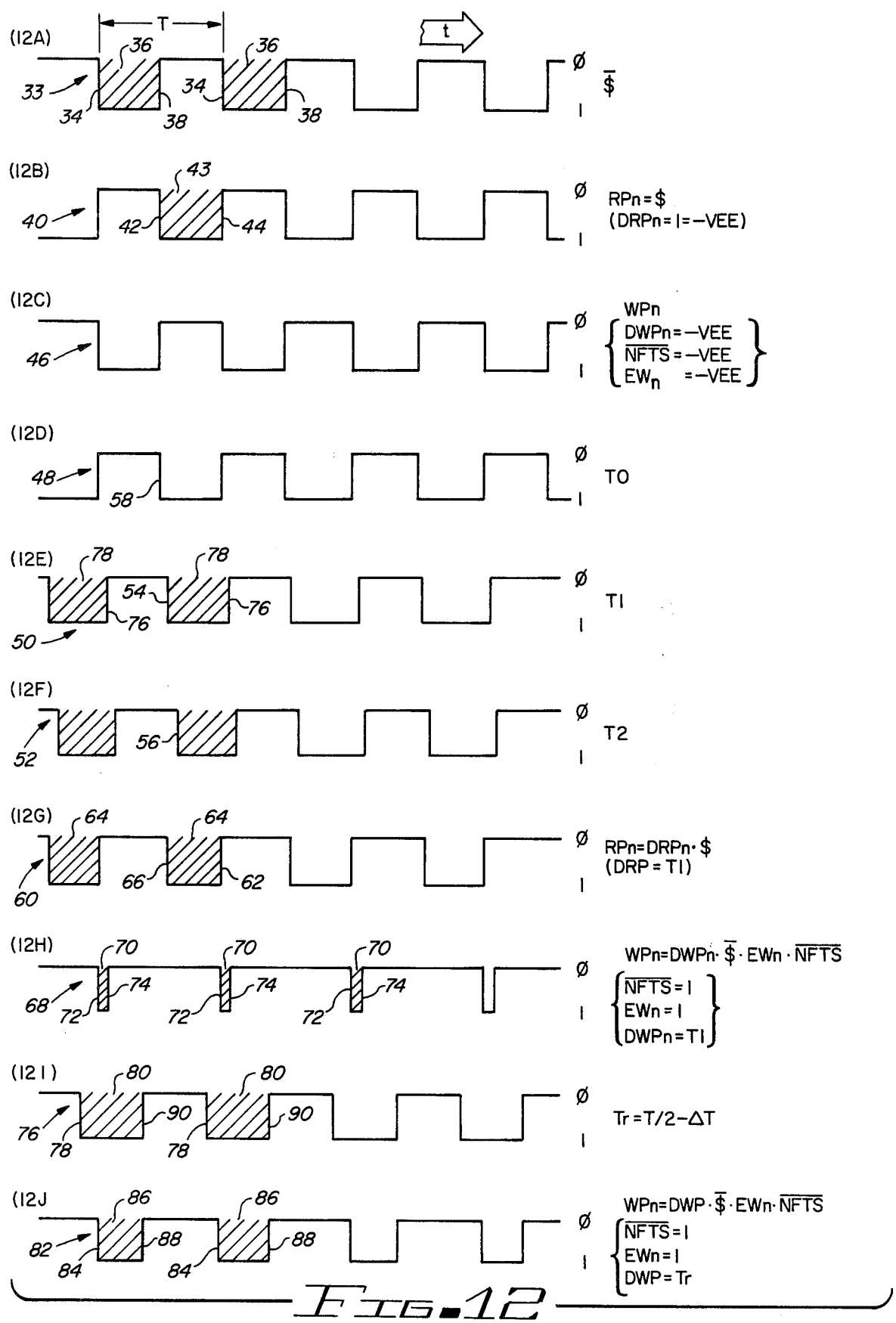

CLOCK PULSE DRIVER

BACKGROUND OF THE INVENTION

1. Field of the Invention

This invention relates generally to digital logic circuitry, and more particularly to an improved current mode clock pulse driver which is capable of producing a first set of individually enabled controllable pulse width clock signals having a first predetermined relationship to the pulses of the system clock applied to the driver and which circuit is also capable of producing a second and third set of clock pulse signals the pulse widths of the pulses of each of the second and third sets of signals are also controllable, said second and third sets of clock signals each having a predetermined relationship with the pulses of the clock signal applied to the pulse driver.

2. Description of the Prior Art

In synchronous digital data processing systems, digital signals representing data or instructions are stored in storage devices such as registers and such signals are transmitted between registers which are enabled, or strobed, by clock pulses, or strobes, which can also be used to enable, or strobe, active devices for manipulating or controlling digital signals. Examples of such active devices are switches, adders, comparators, arithmetic and logic units and the like. In larger high speed digital systems, the clock pulse signal from a precisely controlled oscillator, or the system clock, is distributed to many printed circuit boards or substrates to co-ordinate the activities of the system. Since not all of the paths traveled by the system clock are precisely the same length, the pulses of the system clock will arrive at different portions of the system at different times.

Certain actions in a clocked or synchronous system require less than a full clock, the period of time between adjacent leading edges of the clock pulses of the system clock. To improve the performance of the system clock., a second clock signal is frequently distributed having the same frequency as the system clock, however the leading edges of pulses of the second clock will be displaced in time, some predetermined amount, or period of time, with respect to the leading edges of the pulses of the system clock. The availability in a system of such a second clock pulse signal, or strobe, permits the designers of such digital data processing systems to improve performance or throughput of certain parts of the system for those operations in which the time for data signals to be operated on is less than the period T of the system clock.

A particular example in which the availability of a second clock pulse, or strobe, is useful occurs in the addressing of a random access memory such as a high speed cache where the register in which the address is stored is strobed, or enabled, by a register clock pulse and the data is written into or read from the addressed memory location by a write clock pulse, or strobe. To achieve maximum performance from such memories, and other elements of the data processing system it is also necessary to vary the pulse widths of the pulses of the register and write clock pulse signals.

The prior art larger high speed digital data processing systems have solved the problem of providing a second clock signal having the same frequency, or period, as the system clock by the use of delay lines to delay the second clock signal with respect to the system clock a fixed percentage of the period of the system clock. The second clock is then distributed throughout the system in the same manner as the system clock. The problem with such a solution is the difficulty in making the propagation delays of the signal in the transmission of the two clocks substantially the same throughout the system in order to maintain substantially constant the desired relationship between the leading edges, for example, of the two clock signals the same.

There is a need in large high speed digital data processing systems having a clock pulse rate, such that the periods of the signals is in the range of 25-50 nanoseconds, for a clock pulse driver to which a single clock signal at the desired frequency, the system clock, can be applied and which can produce a plurality of write pulses and a plurality of register pulses, the widths of the pulses of which are controllable and the delay with respect to the system clock is precisely controllable to provide the clock signals needed by a significant number, from 50 to 100 of integrated circuit chips which may be packaged together on a printed circuit board, or substrate, from a driver circuit which is also adapted to be mounted on such board or substrate.

SUMMARY OF THE INVENTION

The present invention provides a clock pulse driver circuit which can provide the clock pulse signals, or strobes, needed by a plurality of integrated circuits such as are packaged on a single substrate or printed circuit board. The clock pulse driver circuit produces a first set of individually enabled first clock pulse signals, a second set of second clock pulse signals and a third set of third clock pulse signals. The clock pulse driver circuit has applied to it the system clock pulse signal, a first, a second and a third delay signal, for the first, second and third sets of clock pulse signals produced to vary the pulse widths of the sets of clock signals so produced. A set of enable signals determine which of the first set of clock pulse signals are produced. The leading edges of the pulses of the first set of clock pulse signals substantially coincide in time with the leading edges of the pulses of the system clock and the trailing edges of the pulses of the second and third sets of clock pulse signals substantially coincide with the leading edges of the pulses of the system clock. The driver also produces delay signals which can be used as the source of the delay signals to vary the pulse widths of the sets of clock pulse signals produced.

It is therefor an object of this invention to provide an improved current mode clock pulse driver for high speed digital data processing systems.

It is another object of this invention to provide an improved clock pulse driver for high speed digital data processing systems which produce sets of clock signals sufficient to drive a plurality of integrated circuit chips which chips can be packaged with the pulse driver.

It is yet another object of this invention to provide a clock pulse driver that produces sets of output clock pulse signals having different relationships to the pulses of the system clock but which have substantially the same period as the pulses of the system clock, and which output clock signals are capable of providing the clock signals required by a large number of integrated circuit chips so that only the system clock needs to be distributed throughout the data processing system while the system performance of the data processing system is substantially the equivalent of that of a data processing system in which a system clock and one or more secondary clock signals are distributed throughout the data processing system.

BRIEF DESCRIPTION OF THE DRAWINGS

Other objects, features and advantages of the invention will be readily apparent from the following description of a preferred embodiment thereof, taken in conjunction with the accompanying drawings, although variations and modifications may be effected without departing from the spirit and scope of the novel concept of the disclosure, and in which:

FIGS. 4A through 11A illustrate the various logic symbols used in FIG. 2; and FIGS. 4B through 11B are schematics of the circuits for performing the functions represented by the corresponding logic symbols of FIGS. 4A–11A.

FIGS. 12 A-S illustrate the timing relationships between certain signals of this invention.

DETAILED DESCRIPTION OF THE INVENTION

Figure 1:
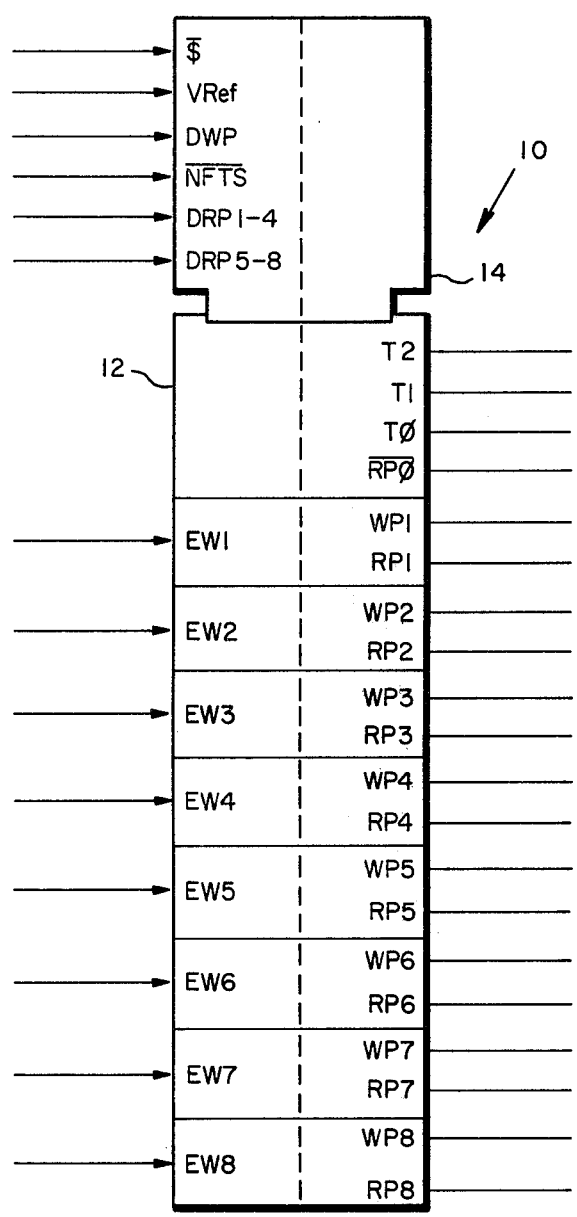
FIG. 1 is a symbolic representation of the current mode clock pulse driver circuit of the present invention.

FIG. 1 is a symbolic representation of the current mode clock pulse driver circuit 10 of the present invention. Clock pulse driver circuit 10, which, in the preferred embodiment, is implemented on a single integrated circuit chip, comprises an input portion 12 and an output portion 14, with the input portion adapted to receive input signals applied to driver circuit 10 and output portion 14 providing, or producing, the output signals of circuit 10.

Input portion 12 receives as inputs the system clock, $\overline{S}$, at the terminal denoted $\overline{S}$ in FIG. 1. In addition input portion 12 also receives a reference voltage VRef, a first delay, or disable, signal for delaying a first set of clock pulses produced by circuit 10, or delay, or disable, write pulse signal DWP, a first enable signal, denoting that a nonfunctional test of the system during which certain outputs of circuit 10 are not wanted is not in process, which is denoted NFTS, a second delay signal for delaying a second set of output clock pulse signals said second delay signal being denoted as delay register pulses DRP(1-4); and a third delay signal for delaying a third set of output clock pulse signals, said third delay signal being denoted as delay register pulses DRP(5-8); and a set of enable signals for enabling each of the clock pulse signals of the first set of write pulses with said enable write signals being denoted EW(1-8). Each of the terminals to which these signals are applied is identified by the identifier of the signal in input portion 12.

Circuit 10 produces output signals which are present, or applied, to the output terminals of the output portion 14. The first set of output clock pulse signals are the write clock pulse signals designated WP each of which is enabled by a write enable signal EW(1-8). These signals are commonly used as write pulse signals for a random access memory, thus the name. The second set of output clock pulse signals are register clock pulse signals RP(1-4), and the third set of output clock pulse signals are the register clock pulse signals, RP(5-8) since they are commonly used to strobe data into address registers. In addition circuit 10 produces delay signals T0, T1, T2 and a signal $\overline{RP0}$, inverted register pulse zero. The output terminals of output portion 14 to which the above identified output signals are applied are identified by the designation of the signals present, or available at each such terminal. In addition to the input signals applied to input portion 12, circuit 10 also has applied to it, or is connected to the power supply voltage $-VEE$, ground, and a source of reference voltages VRef(1-3) needed to make the current mode circuits of driver circuit 10 operative. The terminals which connect the integrated circuit driver 10 to the ground, $-VEE$ and VRef(1-3) are not illustrated in FIG. 1 since they are conventional and well known in the art.

Figure 4A:
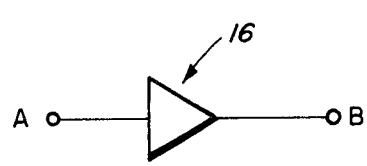
Figure 4B:
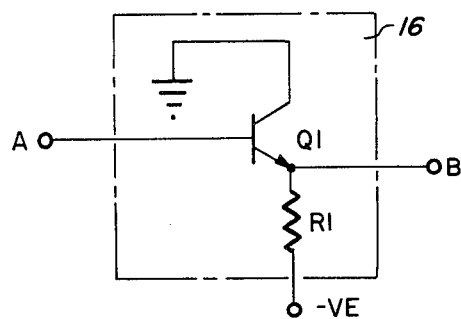
Figure 5A:
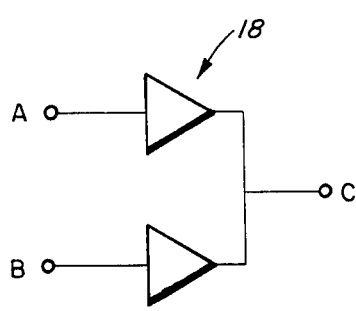
Figure 5B:
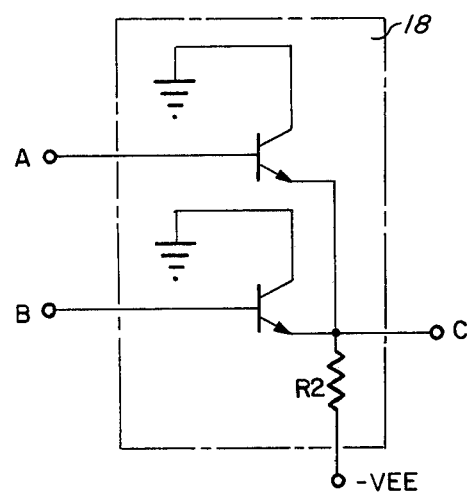

The current mode clock pulse driver circuit 10 employs soft saturating current mode logic CML gates. Circuit 10 in the preferred embodiment consists of several CML circuits. The circuits and the symbols designating them are illustrated in FIGS. 4–11. In each of FIGS. 4–11 A and B a logic symbol is illustrated together with a detailed schematic of one of the equivalent electrical circuit. The overall logic architecture includes lower level gates and upper level gates which gates produce an output voltage swing of approximately 0.5 volts. The limited voltage swing reduces the amount of power consumed, and commensurably the heat produced. In addition the transition time between logic states, or the gate delays of logic circuits are reduced significantly when compared with equivalent circuits implemented in semiconductor devices that saturate in one of their logic states. In FIG. 4A, logic symbol 16 is for an emitter follower having an input A and an output B. Emitter follower circuit 16 is used in the present invention primarily as a voltage translator shifting the voltage applied to input A downwardly by substantially 0.8 volts, the base to emitter drop of transistor Q1 at output B. FIG. 4B illustrates the equivalent circuit in which input A is applied to the base of NPN transistor Q1 and output B is taken at the common terminal or junction of resistor R1 and the emitter of transistor Q1. In FIG. 5A, symbol 18 identifies a circuit having two inputs A and B and an output C. The equivalent circuit of logic symbol 18 is illustrated in FIG. 5B in which input A is applied to the base of transistor Q2 and input B is applied to the base of transistor Q3. Output C is taken from the common junction of resistor R2 and the emitters of transistor of Q2 and Q3.

Figure 6A:
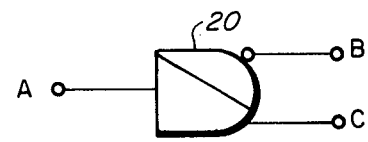
Figure 6B:
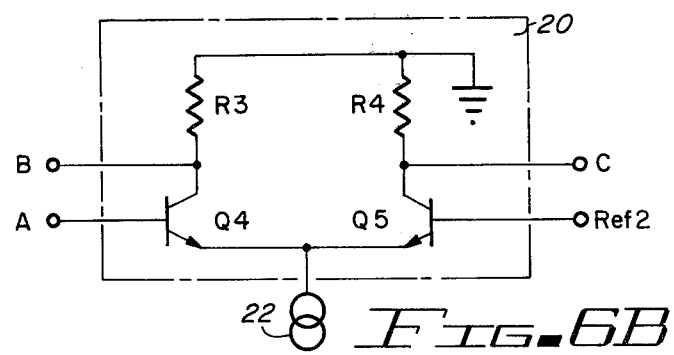
Figure 7A:
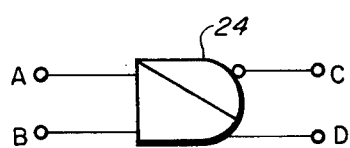
Figure 7B:
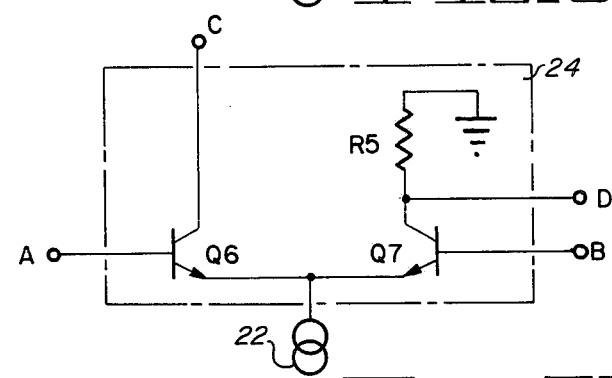

FIGS. 6–8 illustrate various configurations of two transistor (CML) gates. Logic symbol 20 illustrated in FIG. 6A has one input A and produces two outputs B and C. In FIG. 6B it is seen that input A is applied to the base of transistor Q4 while the base of transistor 5 is tied to VRef2, a direct current voltage with values specified below. Output B is taken from the common terminal of resistor R3 and the collector of Q4. Output C is taken from the common terminal, or junction, of resistor R4 and the collector of transistor Q5. The emitters of transistors Q4 and Q5 are connected to a constant current source 22, the symbol for which is illustrated in FIG. 6B. Output signal B is inverted with respect to signal A and thus is the inverted or false output of gate 20 while output of C is in phase with A and is thus the true, or noninverted, output. Logic symbol 24 illustrated in FIG. 7A has two inputs A and B and produces two output signals C and D. In FIG. 7B it can be seen that signal A is applied to the base of transistor Q6 and input signal B is applied to the base of transistor Q7. Output C is connected to the collector of transistor Q6. The collector of transistor Q6 is connected to ground through a collector resistor of a gate such as gate 24 which is illustrated in FIG. 7B. Output D is taken from the common terminal of resistor R5 and the collector of Q7. Either A or B would normally be a reference voltage.

Figure 8A:
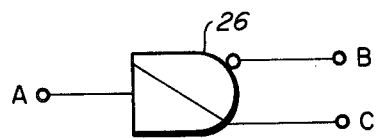
Figure 8B:
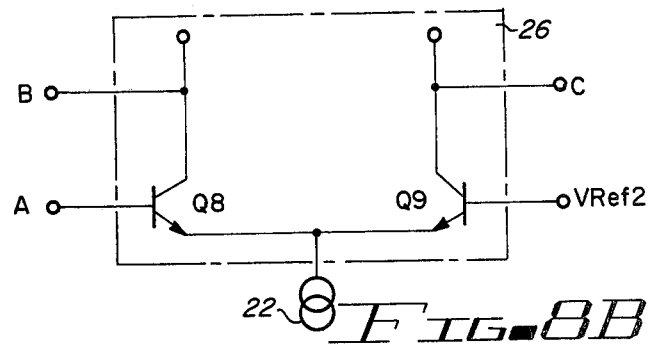

Logic symbol 26 which is illustrated in FIG. 8A has a single input A and two outputs B and C. As illustrated in FIG. 8B input A is applied to the base of transistor Q8 while the base of transistor Q9 is connected to a source of reference voltage VRef 2. Output B is connected to, or taken from the collector of Q8 and output C is connected to or taken from the collector of Q9. The collectors of Q8 and Q9 are connected through the collector resistors of other gates to ground.

Figure 9A:
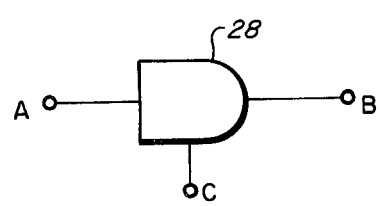
Figure 9B:
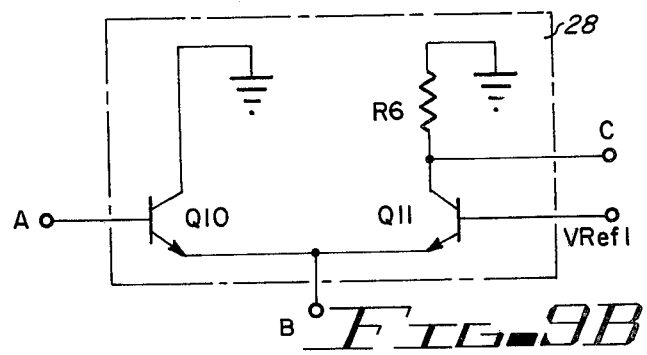

In FIG. 9A the logic symbol for an upper level gate 28 is illustrated. Gate 28 has two inputs, A and B and produces an output signal C. As seen in FIG. 9B, input signal A is applied to the base of transistor Q10 while the base of transistor Q11 is connected to reference voltage VRef 1. The other input B is applied to, or connected to, the common connection between the emitters of transistors Q10 and Q11. The collector of Q10 is connected directly to ground and the connector of Q11 is connected through collector resistor R6 to ground. Output signal C is taken from the connection between resistor R6 and the collector of transistor Q11.

Figure 10A:
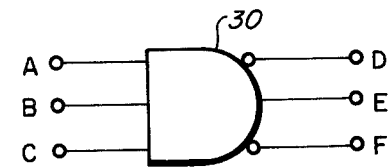
Figure 10B:
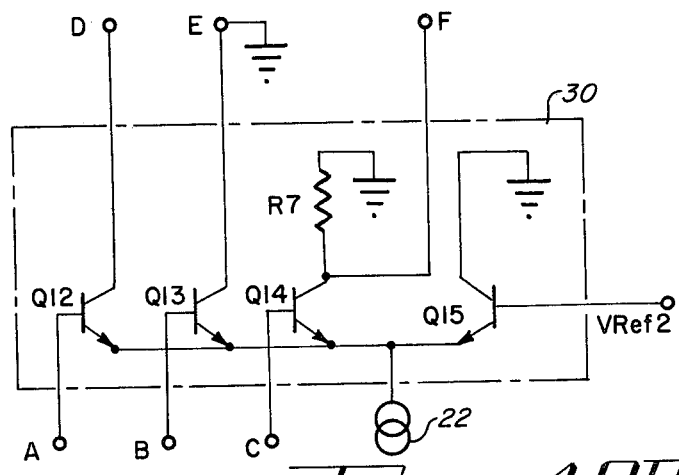

In FIG. 10A, logic symbol 30 is illustrated. Gate 30 is a three input low level CML gate. The input signals to gate 30 are A, B and C and the output signals are D, E and F. Referring to FIG. 10B, input A is applied to the base of transistor Q12, B to the base of Q13, and C to the base of Q14. The base of transistor Q15 is connected to reference voltage VRef2. The collector of Q12 is adapted to be connected to terminal B of gate 28, for example, the collectors of Q13 and Q15 are connected directly to ground and the collector of Q14 is connected through collector resistor R7 to ground. The output signal F is taken from the collector of Q14.

Figure 11A:
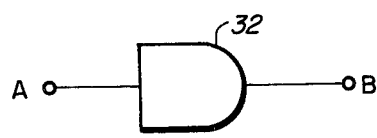
Figure 11B:
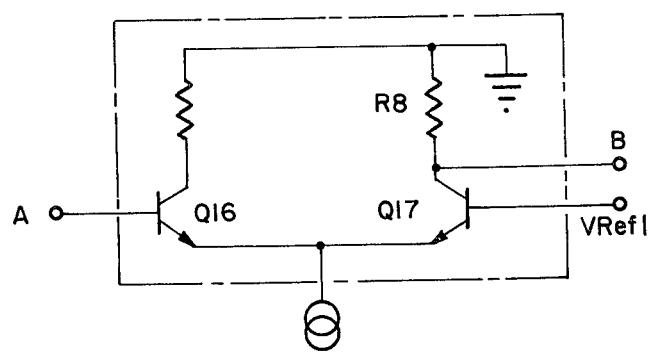

Logic symbol 32 which is illustrated in FIG. 11A is used to provide a predetermined delay to the signals applied thereto. The input signal is A and the output signal is B. As seen in the circuit diagram of gate 32 in FIG. 11B, A is applied to the base of transistor Q16 while the base of transistor Q17 is tied to reference voltage VRef2. Output signal B is taken from the true output terminal, the common connection between resistor R8 and the collector of transistor Q17.

In the preferred embodiment reference voltage VRef-1 has a value substantially −0.26 volts, VRef2 has a value of substantially −1.08 volts and VRef3 has a value of −1.08 volts. VEE has a value of substantially −3.3 volts.

Figure 2:
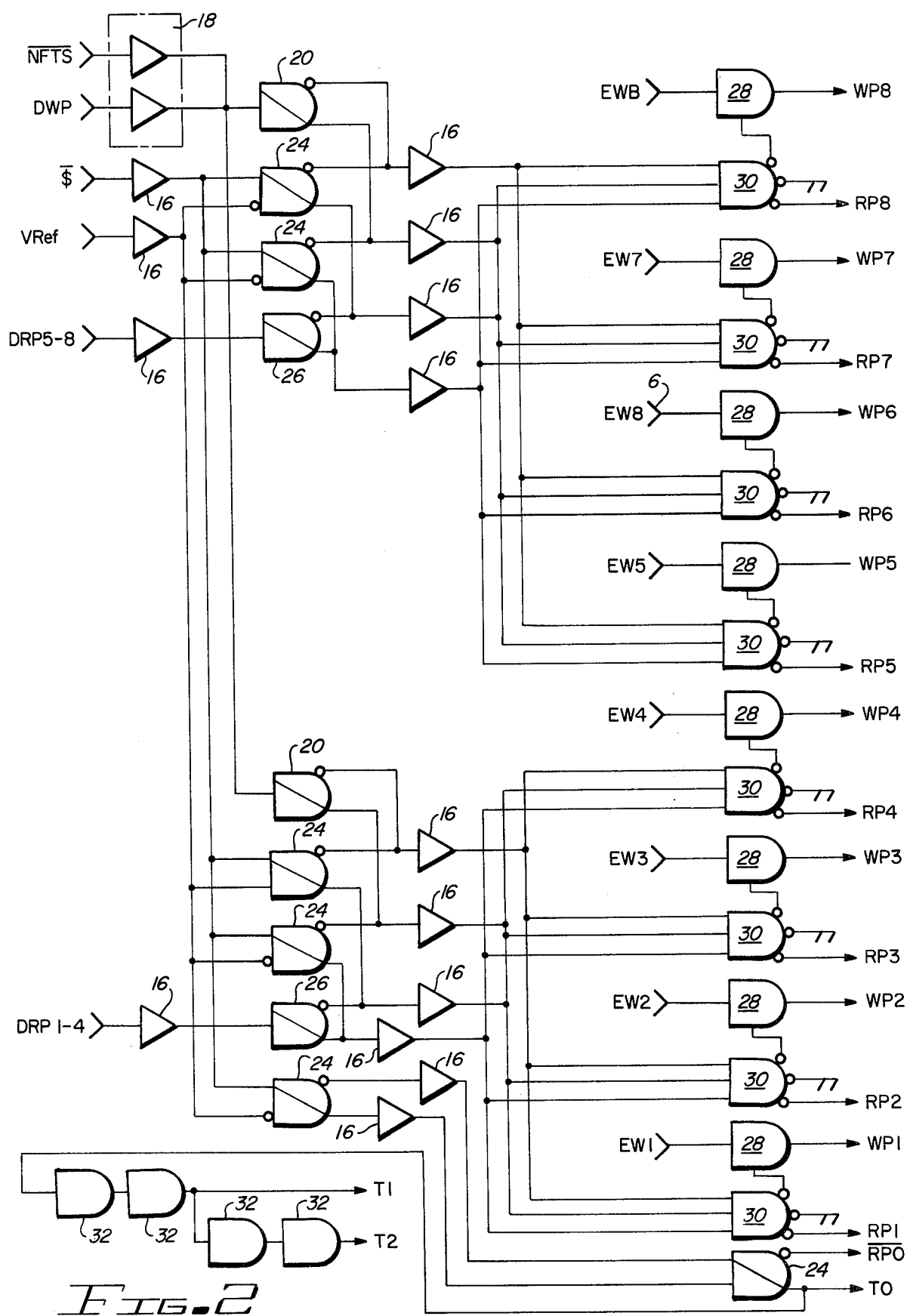
FIG. 2 is a schematic block diagram of the preferred embodiment of the current mode clock pulse driver of the present invention.
Figure 3:
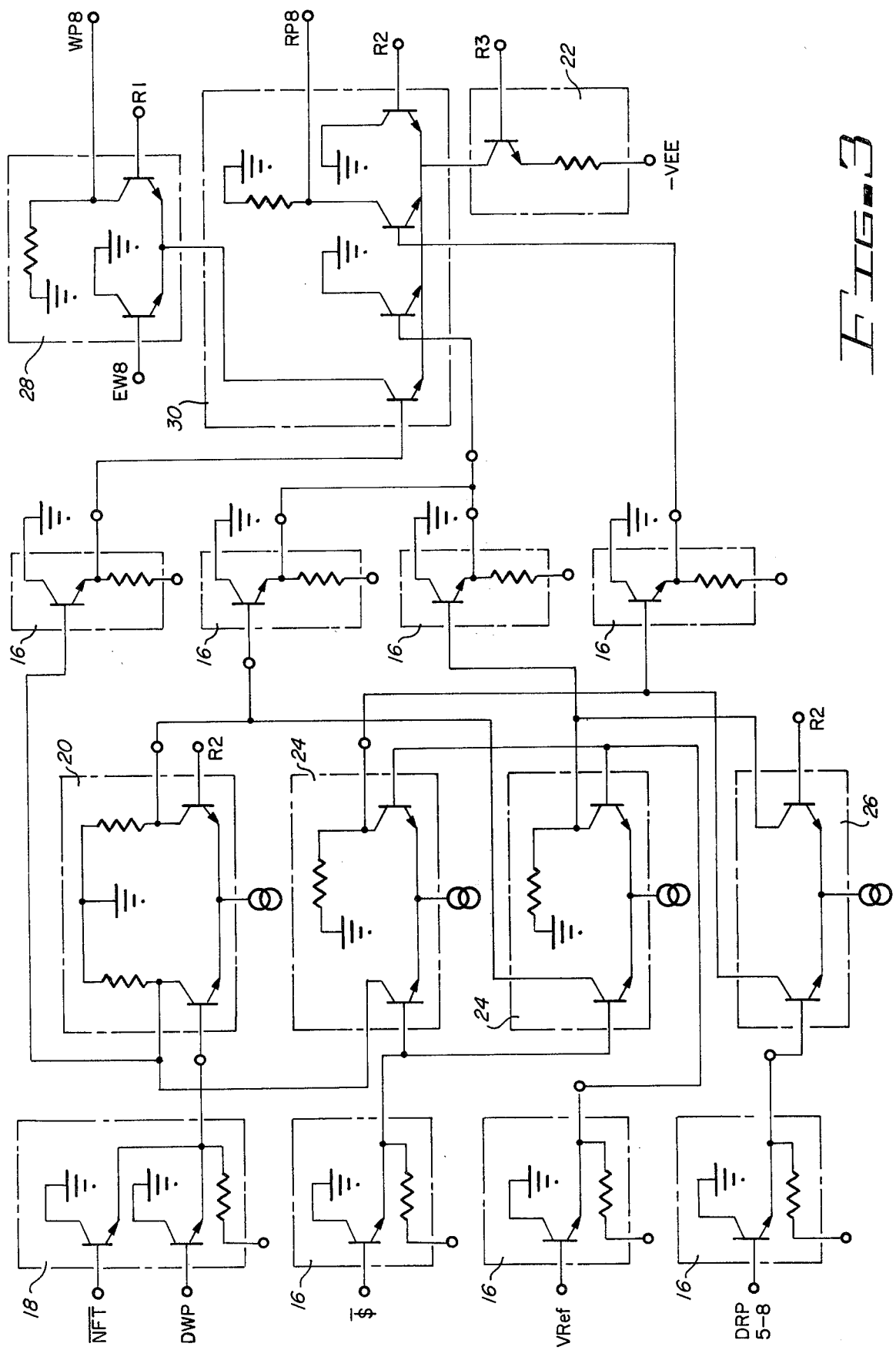
FIG. 3 is a circuit diagram of a portion of the block diagram of FIG. 2.

FIG. 2 is a schematic block diagram of the preferred embodiment of the invention in which the logic symbols illustrated in FIGS. 4A–11A are utilized to illustrate the electrical components and their interconnections to produce the desired output signals. FIG. 3 is a circuit diagram of that part of driver circuit 10 illustrated in FIG. 2 which is utilized to produce one of the first set of selectively enabled clock pulse signals, WP8, for example, and one of the third set of register clock pulse signals RP8. In FIG. 3 dashed lines or blocks are drawn around the circuit elements corresponding to the logic symbols of FIG. 2. From the foregoing, the manner of implementing circuit 10 or interconnecting the components thereof would be, to one skilled in the art, straightforward.

The interconnected circuit elements of clock pulse driver 10 in response to the applied signals designated $\overline{S}$, VRef, DWP, $\overline{NFTS}$, DRP(1-4), DRP(5-8), and EW(1-8) produce the output signals WP(1-8), RP(1-4), RP(5-8), T0, T1, T2 and RP0 in accordance with the following logic equations:

1. $WP(n) = EW(n) \cdot \overline{NFTS} \cdot DWP \cdot \overline{S}$ where n is an even integer other than 0, eight in the preferred embodiment.

2. $RP(1-n/2) = DRP(1-n/2) \cdot S$
3. $RP((n/2+1)-n) = DRP((n/2+1)-n) \cdot \overline{S}$
4. $T0 = S$ and
5. $\overline{RP0} = \overline{S}$.

As can be seen from a perusal of FIG. 2 the output signals WP(n), RP(1−n/2), RP((n/2+1)+n) T0 and RP0 are produced from the applied input signals after passing through the same number of gates so that the delay or phase relationship between the output signals is not varied because of having to pass through different numbers of gates. There is a small delay, or timing difference between the system clock $\overline{S}$ and $\overline{RP0}$, and $\overline{S}$ and T0. Since this delay is substantially the same for all paths through the circuit, it can be ignored for all practical purposes.

Interchanging the terminals to which the system clock $\overline{S}$ and VRef are applied to circuit 10, or applying $\overline{S}$ to the terminal of circuit 10 to which VRef is indicated as being connected in FIGS. 1 and 2 and VRef to the input terminal to which $\overline{S}$ is indicated as being connected is the equivalent of inverting the system clock $\overline{S}$ in equations 1-5.

Referring to FIG. 12A the wave form of the system clock pulse signal $\overline{S}$ pulsed signal 33 has a period T where T is the time between the leading edge 34 of a negative pulse 36 where the leading edge is the transition of the voltage from the value denoted 0 to the value denoted 1. The signal $\overline{S}$ is in the preferred embodiment, though it is not a requirement, symmetric so that the trailing edge 38 of each pulse 36 occurs substantially in the middle of the period T as is seen in FIG. 12A. The pulse width of pulses 36 of system clock pulsed signal 33 is the time between the leading edges 34 and the trailing edge 38 of a given pulse 36. The system clock $\overline{S}$ varies between two voltage levels denoted 0, or ground; and 1, or −0.5 volts, in the preferred embodiment. If the two delay signals DRP(1-4) and DRP(5-8) are tied to −VEE, the output of pulsed clock signals RP(n), 40 as illustrated in FIG. 12B will have the form and relationship to the system clock signal $\overline{S}$, illustrated; i.e. RP(n) is substantially the equivalent of the inverted system clock $\overline{S}$ which inverted clock signal is denoted by the symbol $. The period and pulse width of the pulses 43 of register clock pulse signals RP(n) are substantially the same as for the system clock $ except that the leading edges 42 of pulses 43 substantially coincide with the trailing edges 38 of the pulses 36 of system clock $ and the trailing edges 44 of pulse 43 substantially coincide with the leading edges 34 of the pulses 36 of system clock $\overline{S}$. The set of write clock pulses 46 illustrated in FIG. 12C assumes that the delay signal DWP, the signal $\overline{NFTS}$ and the write enable signals EW(1−n) are all tied to logical 1 voltage level or are connected to −VEE. The set of write pulse signal WP(n) will be substantially in phase with the system clock. The delay signals T0, T1 and T2, wave forms 48, 50, 52 illustrated in FIGS. 12D, 12E and 12F are substantially in phase with the inverted system clock signal $\overline{S}$ with the leading edges 54, 56 of the pulses of signals T1 and T2 delayed by the time it takes these negative going excursions of the voltage to pass through the plurality of gates 32 which are illustrated near the bottom of FIG. 3. The leading edges 58 of the pulses of delay signal T0 occur substantially at the same time as the trailing edges 38 of each negative going pulse of the system clock signal $\bar{S}$. It should be noted that the pulse widths of the negative going pulses of delay signals T0, T1 and T2 are substantially the same as the pulse widths of the negative going pulses 36 of the system clock $\bar{S}$.

Register clock pulse signal RP(n) 60 as illustrated in FIG. 12G assume that the delay signals DRP(n)=T1 which can be accomplished by connecting the delay signal T1 to the input terminal denoted DRP(1-4) and DRP(5-8). The trailing edge 62 of each negative going pulse 64 of signal 60 substantially coincides with the leading edge 34 of each negative going pulse 36 of system clock $\bar{S}$. The leading edges 66 of pulses 64 substantially coincide with the leading edges 54 of the pulses 78 of delay signal T1. Write pulse signals 68 illustrated in FIG. 12H has negative going pulses or strobes 70 having the pulse width illustrated if NFTS and the enable signal EW(n) are logical ones, or are connected to $-$VEE, and DWP=T(1), or the T1 output terminal of circuit 10 is connected to the DWP input terminals of circuit 10. The leading edges 72 of pulses 70 will substantially coincide with the leading edges 34 of the system clock pulse signal $\bar{S}$. The trailing edges 74 substantially coincide with the trailing edge 76 of the negative going pulses 78 of delay signal T1 in this example.

While circuit 10 produces delay signals T0, T1 and T2 which can be used to vary the pulse widths of the write and register pulses as described above, other delay signals may be used such as would be produced by passing T0 through a conventional delay line to delay its leading edge by one half a period T/2 minus ΔT, for example. In FIG. 12I the wave form of a delay signal T(r), 76 is illustrated in which T0 is delayed by an amount of time equal to T/2-ΔT. The leading edges 78 of each negative going pulse 80 of Tr lags, or trails, the leading edges 34 of the pulses 36 of the system clock signal $\bar{S}$.

In FIG. 12J the wave forms of write pulses WP(n), 82, are illustrated. The leading edges 84 of the pulses 86 substantially coincide in time with the leading edges of system clock pulses 36 while the trailing edges 88 substantially coincide with the trailing edges 90 of the pulses 80 of time delay signal Tr.

It will be apparent to those skilled in the art that the disclosed improved current mode clock pulse driver may be modified in numerous ways and may assume many embodiments other than that specifically set out and described above.

Accordingly, it is intended by the appended claims to cover all modifications of the invention which fall within the true spirit and scope of the invention.

What is claimed is:

1. A current mode clock pulse driver for producing n individually enabled first clock pulse signals, p second clock pulse signals, and q third clock pulse signals where n, p and q are integers other than zero, all signals having two values denoted 0 and 1; said driver comprising:

circuit means for receiving a system clock pulse signal, a first delay signal for said first signals, a second delay signal for said second signals, a third delay signal for said third signals, and n enable signals, one for each of the first clock pulse signals produced;

circuit means for producing each of the n first clock signals at a time at which the enable signal for each of the n first clock signals and the system clock pulse signal and the first delay signal, each have a predetermined value;

circuit means for producing p second clock signals at a time at which the second delay signal and the inverted system clock signal have a predetermined value; and circuit means for producing q third clock signals at a time at which the third delay signal and the inverted system clock signal have a predetermined value.

2. The clock pulse driver of claim 1 in which n=8, p=4 and q=4.

3. The clock pulse driver of claim 2 in which the predetermined value for the enable signal, the system clock pulse value and the first delay signal is that denoted 1.

4. The clock pulse driver of claim 3 in which the predetermined value for the second and third delay signal and the inverted system clock signal is that denoted 1.

5. A clock pulse driver for producing n individually enabled digital write clock pulse signals, n/2 first digital register clock pulse signals, and n/2 second digital register clock pulse signals from a system clock pulse signal where n is an even integer other than 0, said pulse signals having two values, a logical zero and a logical 1, each pulse of said pulse signals having a leading edge and a trailing edge, comprising:

first circuit means for receiving said system clock pulse signal, a voltage reference signal, a delay write signal, a first delay register clock signal, a second delay register signal, and n write enable signals, said first circuit means producing n write clock pulse signals at a time at which the clock signal, the delay write signal and the write enable signals have predetermined logic values; said first circuit means producing the n/2 first register clock pulse signals at a time at which the system clock signal and the first delay register signal have predetermined logic value; and said first circuit means producing the n/2 second register clock pulse signals at a time at which the clock signal and the second delay register signal have predetermined logic values; and circuit means for producing a second clock pulse signal substantially in phase with the clock signal, and a plurality of delayed clock signals which are substantially 180 out of phase with the clock pulse signal, each such delayed clock signal being a delay write signal, a first delay register signal or a second delay register signal.

6. The clock pulse driver of claim 5 in which n=8.

7. A current mode clock pulse driver for producing n individually enabled digital write clock pulse signals WP(1−n); n/2 digital register clock pulse signals RP((n/2−1)−1) from a digital clock signal $\bar{S}$ where n is an even integer other than 0, said pulse signals having two values, a logical zero and a logical 1, each pulse of each of said signals having a leading edge and a trailing edge, comprising:

first circuit means for receiving said clock signal $\bar{S}$, a voltage reference signal VRef, a delay write signal DWP, a nonfunctional test signal, $\overline{NFTS}$, a first delay register clock signal DRP(1−n/2), a second delay register signal DRP (n/2−1)−n and n write enable signals EW(1−n), said first circuit means producing said write clock pulse signals WP(1−n) at a time at which the following logic equation is satisfied:

$$WP(n) = EW(n) \cdot \overline{NFTS} \cdot DWP \cdot S$$

said register clock pulse signals RP(1−n/2) at a time at which the following logic equation is satisfied:

$$RP(1-n/2) = DRP(1-n/2) \cdot S$$

and said register clock pulse signal RP((n/2+1)−n at a time at which the following logic equation is satisfied:

$$RP((N/2+1-n) = DRP((n/2+1)-n) \cdot S; \text{ and}$$

circuit means for producing a clock pulse RP0 substantially in phase with the clock signal $\overline{S}$ and a plurality of delayed clock signals Tp which are substantially in phase with the inverted clock pulse $\overline{S}$ and in which p equals an integer other than zero; each of said delay clock signal Tp having its leading edge delayed a different period of time relative to the leading edges of the pulses of said clock signal $\overline{S}$.

8. The current mode clock pulse driver of claim 7 in which n=8 and p=3.

* * * * *